US010437940B2

(12) United States Patent
Coros et al.

(10) Patent No.: US 10,437,940 B2
(45) Date of Patent: Oct. 8, 2019

(54) COMPUTATIONAL DESIGN OF LINKAGE-BASED CHARACTERS

(71) Applicant: Disney Enterprises, Inc., Burbank, CA (US)

(72) Inventors: Stelian Coros, Zürich (CH); Damien Gauge, Châtenay-Malabry (FR); Eitan Grinspun, New York, NY (US); Bernhard Thomaszewski, Zürich (CH)

(73) Assignee: Disney Enterprises, Inc., Burbank, CA (US)

( * ) Notice: Subject to any disclaimer, the term of this patent is extended or adjusted under 35 U.S.C. 154(b) by 502 days.

(21) Appl. No.: 14/487,878

(22) Filed: Sep. 16, 2014

(65) Prior Publication Data
US 2016/0077716 A1 Mar. 17, 2016

(51) Int. Cl.
G06F 17/50 (2006.01)

(52) U.S. Cl.
CPC ...... *G06F 17/5009* (2013.01); *G06F 17/5086* (2013.01)

(58) Field of Classification Search
CPC ... G06F 17/5009; G06F 17/5086; Y02T 10/82
USPC ........................................................ 715/765
See application file for complete search history.

(56) References Cited

U.S. PATENT DOCUMENTS 5,043,929 A * 8/1991 Kramer ............... G06F 17/5086
703/1
5,253,189 A * 10/1993 Kramer ............... G06F 17/5086
700/246
5,297,057 A * 3/1994 Kramer ............... G06F 17/5086
345/953
5,377,307 A * 12/1994 Hoskins ................. B25J 9/1605
706/19
5,452,238 A * 9/1995 Kramer ............... G06F 17/5086
345/419
5,625,577 A * 4/1997 Kunii ..................... B25J 9/1671
318/561
5,831,875 A * 11/1998 Hirata ................. G06F 17/5086
703/7

(Continued)

OTHER PUBLICATIONS

Dave's Blog Page, Linkage Mechanism Designer and Simulator, May 1, 2013, url: http://blog.rectorsquid.com/linkage-mechanism-designer-and-simulator/ (Year: 2013).*

*Primary Examiner* — Ryan F Pitaro
*Assistant Examiner* — Henry Orr
(74) *Attorney, Agent, or Firm* — Farjami & Farjami LLP

(57) ABSTRACT

There are provided systems and methods for the computational design of linkage-based characters. The system including a display, a memory storing a software application, and a processor configured to execute the software application to display a linkage on the display, the linkage including a plurality of links and a plurality of motors, each of the plurality of links being connected to at least another of the plurality of links using one of the plurality of motors, receive a user input selecting a first link and a second link from the plurality of links and a motor from the plurality of motors, the motor being located between the first link and the second link, and generate an updated linkage by connecting the first link to the second link using a new link and replacing the motor with a pin.

19 Claims, 8 Drawing Sheets

(56) References Cited

U.S. PATENT DOCUMENTS

| | | | | |
|---|---|---|---|---|
| 5,936,638 | A | * | 8/1999 | Hodgins ................ G06T 13/40 345/473 |
| 6,629,065 | B1 | * | 9/2003 | Gadh ..................... G06T 17/10 345/420 |
| 6,662,148 | B1 | * | 12/2003 | Adler ..................... G09B 23/30 600/407 |
| 8,504,337 | B2 | * | 8/2013 | Foster .................... G06T 19/00 345/419 |
| 2004/0054510 | A1 | * | 3/2004 | Raschke ............ G06F 17/5009 703/6 |
| 2004/0075677 | A1 | * | 4/2004 | Loyall .................... G06F 3/011 715/706 |
| 2008/0091373 | A1 | * | 4/2008 | McGibbon ........... A61B 5/1121 702/95 |
| 2008/0243456 | A1 | * | 10/2008 | Hudetz .............. G06F 17/5086 703/7 |
| 2010/0030532 | A1 | * | 2/2010 | Arora ................. G06F 17/5009 703/2 |
| 2013/0127873 | A1 | * | 5/2013 | Popovic ................. G06T 13/40 345/473 |
| 2014/0316757 | A1 | * | 10/2014 | Coros ................ G06F 17/5086 703/7 |

\* cited by examiner

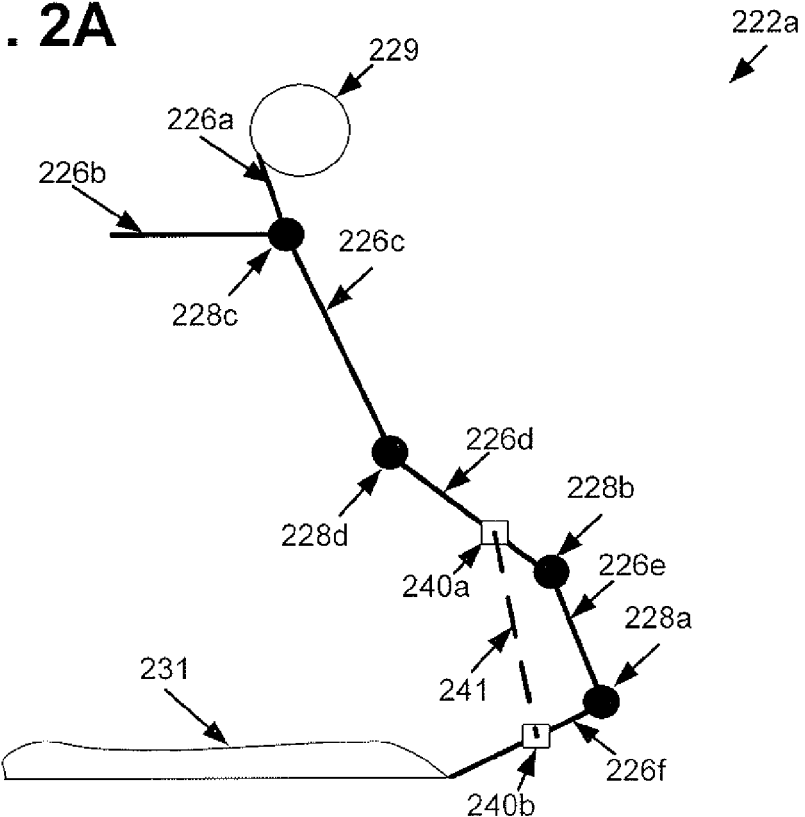
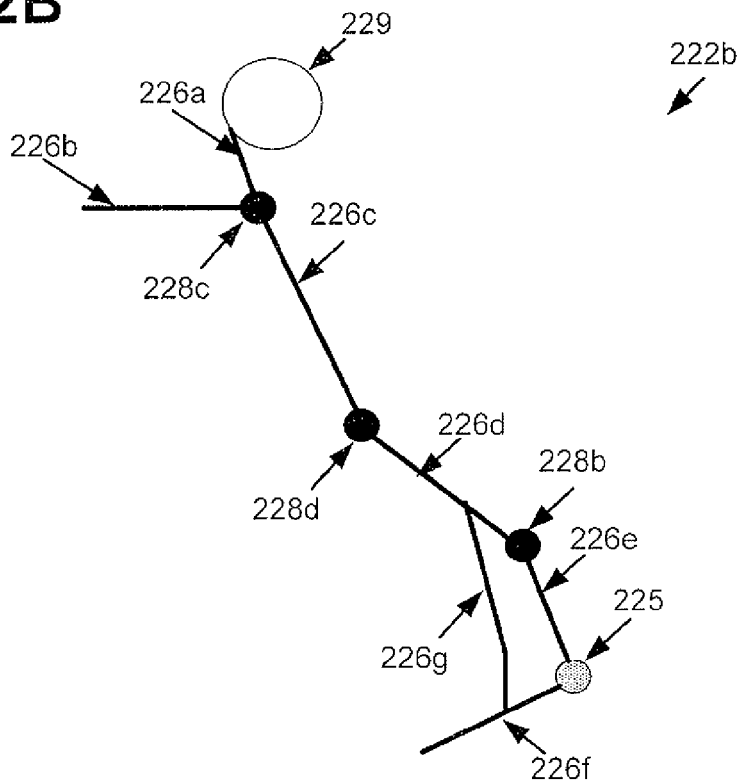

COMPUTATIONAL DESIGN OF LINKAGE-BASED CHARACTERS

BACKGROUND

Video games and movies captivate audiences because they place no limits on the types of environments, characters, and objects that can be created. Rapid manufacturing devices hold the promise of bringing this type of freedom to the real world by allowing anyone to create their own personalized, physical objects. However, the task of designing objects that can be fabricated is typically very challenging and therefore beyond the capabilities of casual users. For example, it can be particularly challenging to create physical representations of virtual characters. As such, casual users may quickly lose interest when trying to design their own physical characters, thus, limiting casual users to designing characters only in the virtual world.

SUMMARY

The present disclosure is directed to the computational design of linkage-based characters, substantially as shown in and/or described in connection with at least one of the figures, as set forth more completely in the claims.

BRIEF DESCRIPTION OF THE DRAWINGS

FIG. 2A present an example of selecting linkage components for topology design, according to one implementation of the present disclosure.

FIG. 2B presents an example of replacing a motor with a new link and pin during topology design, according to one implementation of the present disclosure.

DETAILED DESCRIPTION

Figure 1:
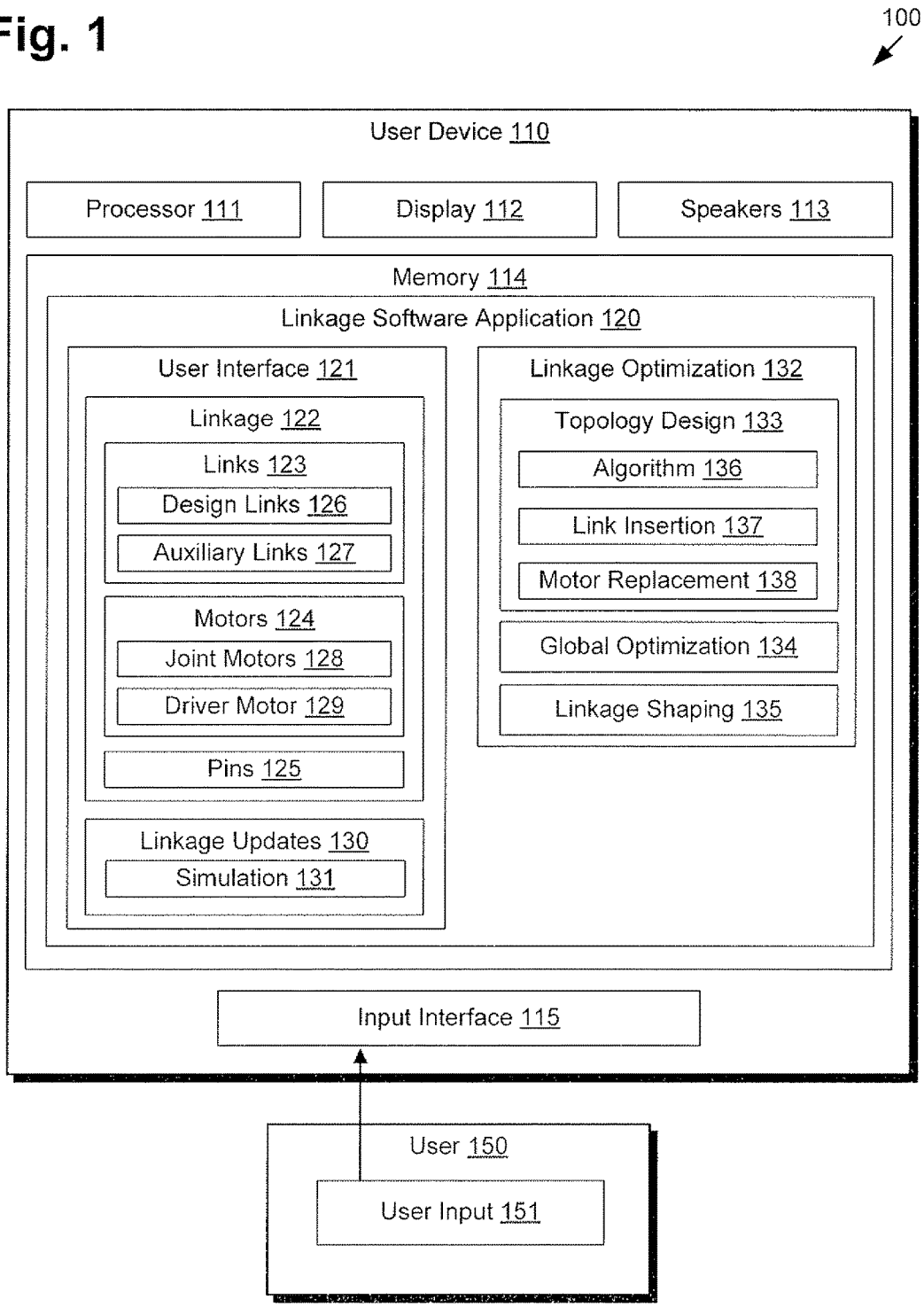
FIG. 1 presents a system for the computational design of linkage-based characters, according to one implementation of the present disclosure.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 presents a system for the computational design of linkage-based characters, according to one implementation of the present disclosure. System 100 of FIG. 1 includes user device 110 and user 150. User device 110 includes processor 111, display 112, speakers 113, memory 114, and input interface 115. Memory 114 includes linkage software application 120, which includes user interface 121 and linkage optimization 132. User interface 121 includes linkage 122 and linkage updates 130. Linkage 122 includes links 123, motors 124, and pins 125. Links 123 includes design links 126 and auxiliary links 127. Motors 124 include joint motors 128 and driver motor 129. Linkage updates 130 include simulation 131. Linkage optimization 132 includes topology design 133, global optimization 134, and linkage shaping 135. Topology design 133 includes algorithm 136, link insertion 137, and motor replacement 138. User 150 includes user input 151.

User device 110 may comprise a personal computer, a server, a mobile phone, a tablet, or any other device capable of executing linkage software application 120 in memory 114. As shown in FIG. 1, user device 110 includes display 112 and input interface 115. Input interface 115 may comprise, for example, a keyboard, a mouse, a game controller, a touch-screen input, a thermal and/or electrical sensor, or any other device capable of accepting user input 151 for use with user device 110. Display 112 may comprise a liquid crystal display (LCD) screen built into user device 110. In alternative implementations of the present disclosure, display 112 may be another type of display hardware, such as cathode-ray tubes (CRT) monitors. In yet other implementations, display 112 may also be touch sensitive and may serve as input interface 115.

User device 110 further includes processor 111 and memory 114. Processor 111 may be configured to access memory 114 to store received input or to execute commands, processes, or programs stored in memory 114, such as linkage software application 120. Processor 111 may correspond to a processing device, such as a microprocessor or similar hardware processing device, or a plurality of hardware devices. However, in other implementations processor 111 refers to a general processor capable of performing the functions required of user device 110. Memory 114 is a sufficient memory capable of storing commands, processes, and programs for execution by processor 111. Memory 114 may be instituted as ROM, RAM, flash memory, or any sufficient memory capable of storing a set of commands. In other implementations, memory 114 may correspond to a plurality memory types or modules.

As illustrated in FIG. 1, user device 110 includes linkage software application 120. User 150 of user device 110 may utilize linkage software application 120 to design optimized linkage-based characters. Linkage software application 120 allows user 150 to design optimized linkage-based characters using user interface 121, which provides user 150 with the ability to design linkage 122. Furthermore, linkage software application 120 allows user 150 the ability to optimize linkage 122 using linkage optimization 132, which optimizes linkage 122 based on design choices made by user 150.

Linkage 122 may include either the linkage-based character that user 150 is designing, or linkage 122 may include different parts of the linkage-based character that user 150 is designing. For example, in one implementation, user 150 may utilize linkage software application 120 to design a complete linkage-based character, such as a linkage-based pig. For a second example, in another implementation, user 150 may utilize linkage software application 120 to design the different parts of the linkage-based character, such as the head, legs, or tail of the linkage-based pig. In such an implementation, user 150 may then utilize linkage software application 120 to combine each part of the linkage-based character designed by user 150 to generate the complete linkage-based character.

Also illustrated in FIG. 1, linkage 122 includes links 123, motors 124, and pins 125. In order to design a linkage-based character, linkage software application 120 first creates linkage 122 to match an input motion provided by user 150. To create linkage 122 to match the input motion provided by user 150, linkage software application 120 transforms each bone of an input skeleton of the linkage-based character into one of links 123, each joint of the linkage-based character into one of pins 125, and creates motors 124 that reproduce the joint trajectories as specified by the input motion. For example, if user 150 is trying to design a linkage-based leg of a pig as linkage 122, links 123 would be used for each bone of the input skeleton for the linkage-based leg of the pig, pins would be used for each joint of the linkage-based leg of the pig, and motors 124 would be used to reproduce the joint trajectories according to a specified input motion from user 150 for the linkage-based leg of the pig.

It should be noted that when discussing links 123, the present disclosure will discuss design links 126 and auxiliary links 127. Design links 126 may include each of links 123 that linkage software application 120 uses when optimizing linkage 122. For example, design links 126 include links 123 that are used in the initial design of linkage 122. Furthermore, design links 126 include links 123 that are added to linkage 122 when linkage software application 120 is optimizing linkage 122. Auxiliary links 127 may include any links 123 added by user 150 to linkage 122 for aesthetic purposes, such as to make linkage 122 look more like the linkage-based character user 150 is trying to design. As such, auxiliary links 127 do not affect the functionality of linkage 122, as the motion of auxiliary links 127 is completely specified by the components to which they are attached.

It should further be noted that when discussing motors 124, the present disclosure will discuss joint motors 128 and driver motor 129. Joint motors 128 may include each of motors 124 that are included in linkage 122 before any optimization of linkage 122 occurs. As such, joint motors 128 are used to connect design links 126 together for the initial linkage 122 design, which will be discussed further below. Driver motor 129 includes the one motor 124 that is used to drive linkage 122 once linkage 122 has been optimized by linkage software application 120.

Also illustrated in FIG. 1, user interface 121 includes linkage updates 130, which includes simulation 131. As will be discussed in further detail below, when optimizing linkage 122, linkage software application 120 may give user 150 more than one option on how to optimize linkage 122. As such, linkage updates 130 includes each of the options given to user 150 for optimizing linkage 122. Furthermore, simulation 131 includes a simulation showing user 150 the motion for each of the options for linkage 122. For example, and using the example above where user 150 is using linkage software application 120 to design a linkage-based leg of a pig as linkage 122, linkage updates 130 includes different options for optimizing linkage 122, while simulation 131 illustrates how each of the different options changes the motion of linkage 122.

Also illustrated in FIG. 1, linkage software application 120 includes linkage optimization 132. As discussed above, user 150 utilizes linkage software application 120 to design optimized linkage-based characters, such as linkage 122. In order for user 150 to optimize linkage 122, linkage software application 120 first generates linkage 122 to include design links 126 connected to each other with joint motors 128 so that linkage 122 is able to reproduce the input motion received by user 150. Linkage software application 120 then utilizes linkage optimization 132 to optimize linkage 122 in three different stages, which include topology design 133, global optimization 134, and linkage shaping 135.

Topology design 133 is used by linkage software application 120 to optimize linkage 122 by both replacing joint motors 128 on linkage 122 with pins 125 using motor replacement 138, and adding a new links to design links 126 using link insertion 137. For example, and as will be discussed and illustrated with regard to FIG. 2, user 150 selects two design links 126 and one of joint motors 128 from linkage 122, where the one of joint motors 128 is located between the two selected design links 126. Linkage software application 120 then uses algorithm 136 from topology design 133 to determine a point on each of the two selected design links 126 whose world-space distance varies the least throughout the motion of linkage 122 as compared to any other points on the two selected design links 126. Linkage software application 120 then uses link insertion 137 to add a new design link connecting the points on the two selected design links 126, and uses motor replacement 138 to replace the one of joint motors 128 selected by user 150 with one of pins 125.

It should be noted that as discussed above, user 150 may further add auxiliary links 127 to linkage 122 for aesthetic purposes. As such, topology design 133 may further include user 150 selecting components, such as design links 126, on linkage 122 for adding auxiliary links 127. For example, after linkage software application 120 finishes replacing each of joint motors 128 on linkage 122 with pins 125, user 150 may add auxiliary links 127 to linkage 122 in order to make linkage 122 look more like the linkage-based character user 150 is trying to design.

After performing topology design 133 on linkage 122, linkage software application 120 may next utilize global optimization 134 to optimize linkage 122 in order to best match the input motion of user 150, which was discussed above. In order to optimize linkage 122 using global optimization 134, linkage software application 120 utilizes global optimization 134 to optimize the location coordinates of all pins 125 that were added during topology design 133 such that the motion of linkage 122 is similar to the input motion from user 150. However, it should be noted that locations for pins 125 used to connect auxiliary links 127 that were added by user 150 to linkage 122 may be omitted from global optimization 134 if their location is important for aesthetic reasons.

After performing global optimization to linkage 122, linkage software application 120 may next utilize linkage shaping 135 to stylize linkage 122 by prescribing curved shapes for selected links 123. For example, linkage software application 120 may receive user input 151 from user 150 selecting links 123 on linkage 122 after topology design 133 and global optimization 134 have been applied to linkage 122. In such an example, linkage software application 120 may then utilize linkage shaping 135 in order to shape each of links 123 selected by user 150, such as by rounding the selected links 123. By applying linkage shaping 135 to linkage 122, linkage software application 120 optimizes linkage 122 to look more aesthetically like the linkage-based character that user 150 is trying to design.

It should be noted that the implementation of FIG. 1 only illustrates user 150 accessing linkage software application 120 stored in memory 114 of user device 110, however, the present disclosure is not limited to the implementation of FIG. 1. For example, in another implementation, linkage software application 120 may be stored on a separate device, such as a server, that user 150 accesses using user device 110. In such an implementation, user device 110 may access the separate device using any wired or wireless technology, such as the Internet.

FIG. 2A present an example of selecting linkage components for topology design, according to one implementation of the present disclosure. FIG. 2A includes linkage 222a, which includes design link 226a, design link 226b, design link 226c, design link 226d, design link 226e, and design link 226f, collectively referred to as design links 226, joint motor 228a, joint motor 228b, joint motor 228c, and joint motor 228d, collectively referred to as joint motors 228, driver motor 229, and simulation 231. FIG. 2 further includes point 240a, point 240b, and distance 241. With regard to FIG. 2, it should be noted that linkage 222a, design links 226, joint motors 228, driver motor 229, and simulation 231 correspond respectively to linkage 122, design links 126, joint motors 128, driver motor 129, and simulation 131 from FIG. 1.

In the implementation of FIG. 2A, a user may be utilizing a linkage software application to optimize linkage 222a, such as user 150 utilizing linkage software application 120 to optimize linkage 122 from FIG. 1, where linkage 222a includes a linkage-based leg of a pig. As such, and as discussed above, the linkage software application first applies topology design to linkage 222a. In order to apply topology design to linkage 222a, the user first selects two of design links 226 and one of joint motors 228 on linkage 222a, where the one of joint motors 228 is between the two of design links 226.

For example, a user may select design link 226d, design link 226f, and joint motor 228a. After selecting each of design link 226d, design link 226f, and joint motor 228a, the linkage software application will utilize topology design to determine a point on design link 226d and a point on design link 226f whose world-space distance varies the least throughout simulation 231 of linkage 222a, where simulation 231 simulates the motion of linkage 222a. As illustrated in FIG. 2A, distance 241 from point 240a on design link 226d to point 240b on design link 226f varies the least during simulation 231, as compared to any other points on design link 226d and design link 226f.

FIG. 2B presents an example of replacing a motor with a new link and pin during topology design, according to one implementation of the present disclosure. As illustrated in FIG. 2B, linkage 222b, which corresponds to linkage 222a from FIG. 2A, now includes pin 225 replacing joint motor 228a and design link 226g connecting design link 226d to design link 226f. For example, and as discussed above, after the linkage software application determines point 240a on design link 226d and point 240 on design link 226f whose distance 241 varies the least during simulation 231, the linkage software application utilizes topology design to insert design link 226g to connect point 240a on design link 226d to point 240b on design link 226f and further replace joint motor 228a with pin 225.

Figure 3:
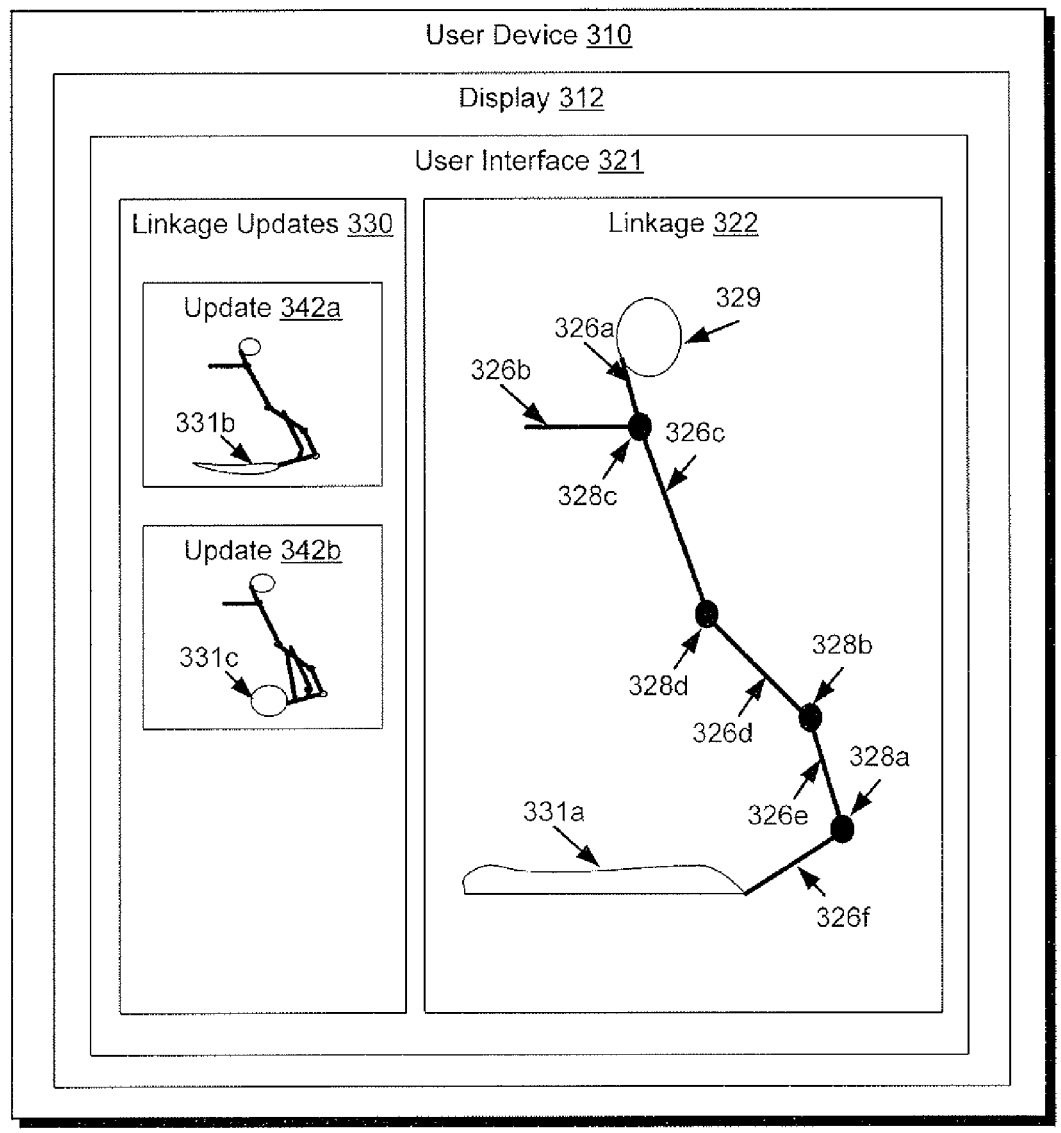
FIG. 3 presents an example of a user interface used in the computations design of linkage-based characters, according to one implementation of the present disclosure.

FIG. 3 presents an example of a user interface used in the computations design of linkage-based characters, according to one implementation of the present disclosure. FIG. 3 includes user device 310, which includes display 312. Display 312 includes user interface 321, which includes linkage 322 and linkage updates 330. Linkage 322 includes design link 326a, design link 326b, design link 326c, design link 326d, and design link 326, collectively referred to as design links 326, joint motor 328a, joint motor 328b, joint motor 328c, and joint motor 328d, collectively referred to as joint motors 328, driver motor 329, and simulation 331a. Linkage updates 330 includes update 342a, which includes simulation 331b, and update 342b, which includes simulation 331c.

With regard to FIG. 3, it should be noted that user device 310, display 312, user interface 321, linkage 322, design links 326, joint motors 328, driver motor 329, and linkage updates 330 correspond respectively to user device 110, display 112, user interface 121, linkage 122, design links 126, joint motors 128, driver motor 129, and linkage updates 130 from FIG. 1. Furthermore, each of simulation 331a, simulation 331b, and simulation 331c correspond to simulation 131 from FIG. 1.

As illustrated in FIG. 3, a user may be utilizing user interface 321 to optimize linkage 322. As such, the user may have selected design link 326d, design link 326f, and joint motor 328a for topology design, which corresponds to the user selecting design link 226d, design link 226f, and joint motor 228a from FIG. 2A. The linkage software application may then have utilized topology design to generate two possible updates that could be applied to linkage 322 from the selection of design link 326d, design link 326f, and joint motor 328a, as illustrated by update 342a and update 342b.

After generating update 342a and update 342b for linkage 322, the linkage software application displays each of update 342a and update 342b in linkage updates 330 of user interface 321. The user can then look at the design of update 342a and the design of update 342b and select which design he or she prefers for linkage 322. Furthermore, the user may simulate update 342a, which is shown as simulation 331b, and simulate update 342b, which is shown as simulation 331c, and compare each of simulation 331b and simulation 331c to simulation 331a when choosing between update 342a and update 342b. For example, the user may simulate each of update 342a and update 342b using user interface 321. In such an example, the user may then select update 342a to apply to linkage 322 since simulation 331b is closer to simulation 331a then simulation 331c is to simulation 331a.

It should be noted that the implementation of FIG. 3 only illustrates providing two different update options for the user in linkage updates 330, however, the present disclosure is not limited to the implementation of FIG. 3. In other implementations, there may be any number of update options for the user in linkage updates 330. For example, in one implementation, the linkage software application may not generate any update options based on the design links and the joint motor selected by the user. In such an implementation, the user would not be provided with any update options in linkage updates 330. For another example, in other implementations, the linkage software application may generate more than two update options based on the design links and the joint motor selected by the user. In such implementations, the user would be provided with each of the (or at least the best) update options in linkage updates 330.

As a preliminary note to FIGS. 4A-4G, FIGS. 4A-4G illustrate an example of optimizing a linkage using a linkage software application. For example, user 150 may be utilizing linkage software application 120 to optimize linkage 122, where linkage 122 includes a linkage-based leg of a pig. In such an example, linkage software application 120 utilizes linkage optimization 132 to optimize linkage 122, where linkage optimization 132 includes topology design 133, global optimization 134, and linkage shaping 135.

Figure 4A:
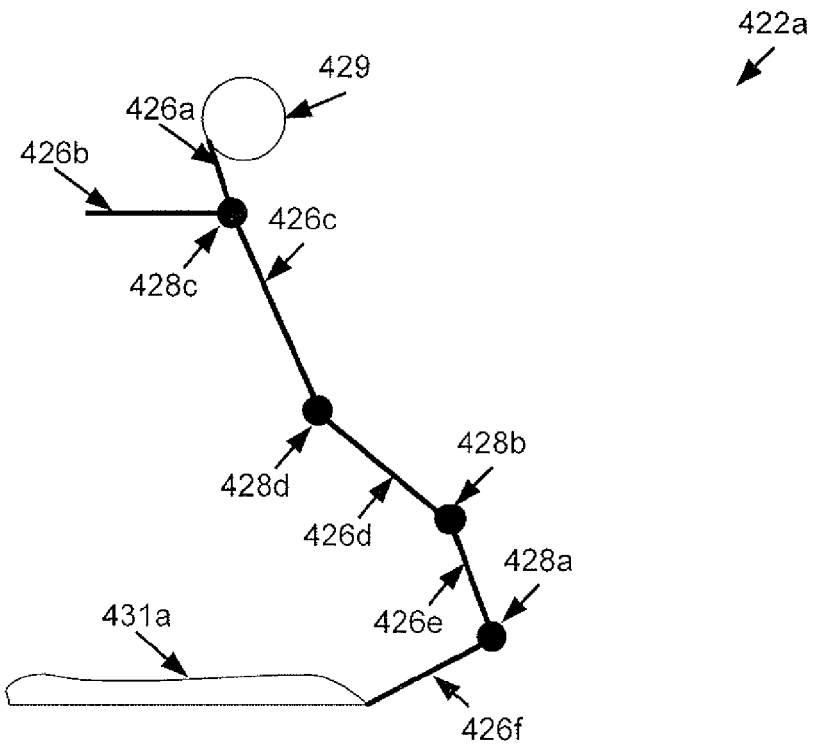
FIG. 4A presents an example of a linkage used for designing a linkage-based character, according to one implementation of the present disclosure.

FIG. 4A presents an example of a linkage used for designing a linkage-based character, according to one implementation of the present disclosure. Linkage 422a of FIG. 4A includes design link 426a, design link 426b, design link 426c, design link 426d, design link 426e, and design link 426f collectively referred to as design links 426, joint motor 428a, joint motor 428b, joint motor 428c, and joint motor 428d, collectively referred to as joint motors 428, driver motor 429, and simulation 431a. With respect to FIG. 4A, linkage 422a, design links 426, joint motors 428, drive motor 429, and simulation 431a correspond respectively to linkage 122, design links 126, joint motors 128, drive motor 129, and simulation 131 from FIG. 1.

In the implementation of FIG. 4A, the user may have selected linkage 422a to optimize. The user may have further input simulation 431a as the motion that the user wants linkage 422a to make. After selecting linkage 422a and simulation 431a, the user may utilize a linkage software application to optimize linkage 422a such that linkage 422a does not include any joint motors 428 and still generates a motion similar to simulation 431a.

Figure 4B:
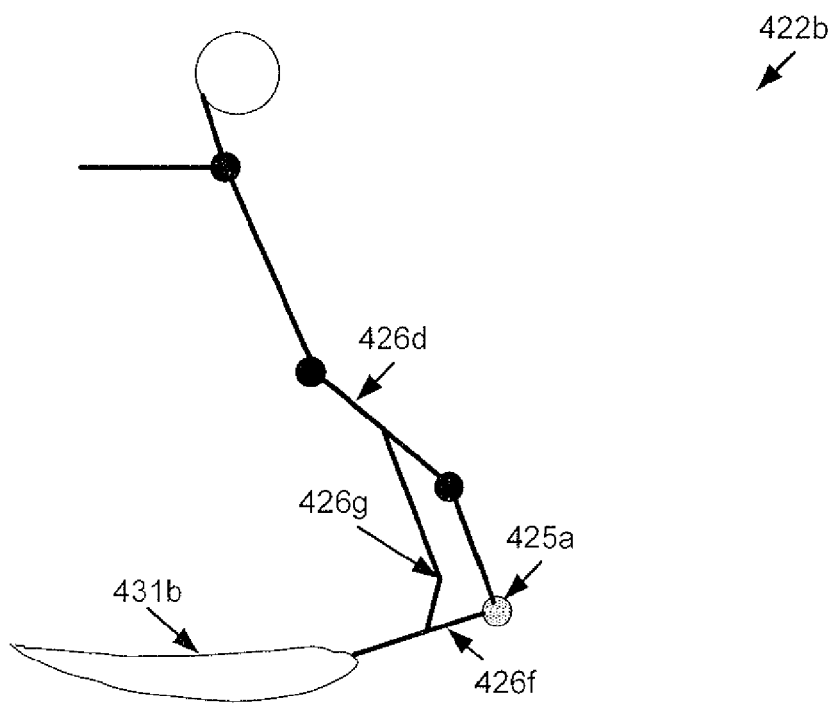
FIG. 4B presents an example of a first topology design step for designing a linkage-based character, according to one implementation of the present disclosure.

FIG. 4B presents an example of a first topology design step for designing a linkage-based character, according to one implementation of the present disclosure. As illustrated in FIG. 4B, the user has selected design link 426d, design link 426f, and joint motor 428a from linkage 422a of FIG. 4A for topology design. In response to the users selection, the linkage software application has connected design link 426d to design link 426f using a new design link 426g, and the linkage software application has further replaced joint motor 428a with pin 425a. As such, simulation 431b of linkage 422b has changed slightly from simulation 431a of linkage 422a.

Figure 4C:
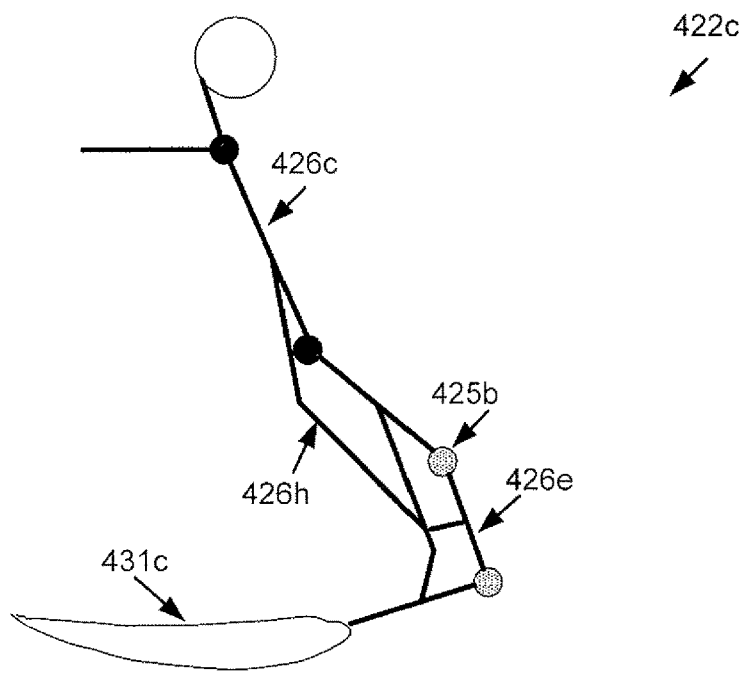
FIG. 4C presents an example of a second topology design step for designing a linkage-based character, according to one implementation of the present disclosure.

FIG. 4C presents an example of a second topology design step for designing a linkage-based character, according to one implementation of the present disclosure. As illustrated in FIG. 4C, the user has selected design link 426c, design link 426e, and joint motor 428b from linkage 422b of FIG. 4B for topology design. In response to the user selection, the linkage software application has connected design link 426c to design link 426d using a new design link 426h, and the linkage software application has further replaced joint motor 428b with pin 425b. As such, simulation 431c of linkage 422c has changed slightly from simulation 431b of linkage 422b.

Figure 4D:
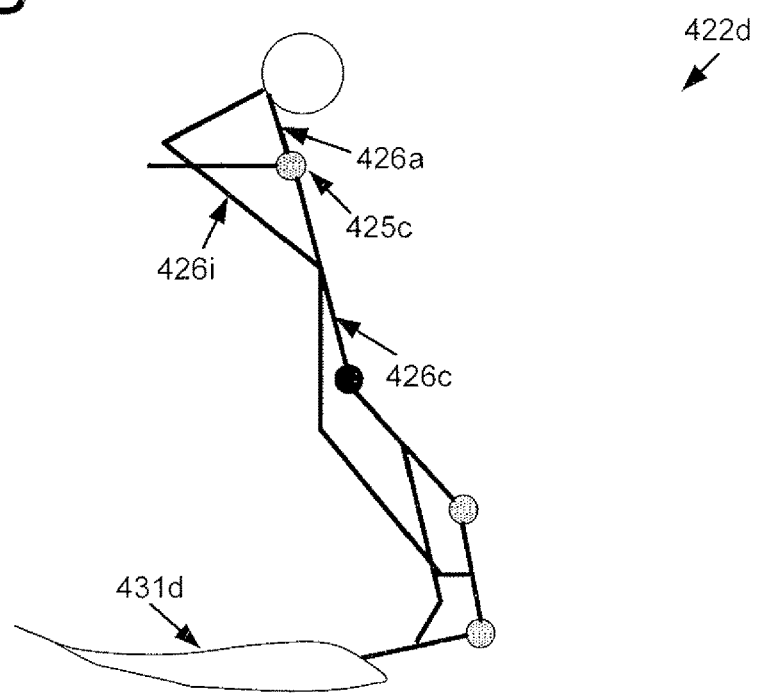
FIG. 4D presents an example of a third topology design step for designing a linkage-based character, according to one implementation of the present disclosure.

FIG. 4D presents an example of a third topology design step for designing a linkage-based character, according to one implementation of the present disclosure. As illustrated in FIG. 4D, the user has selected design link 426a, design link 426c, and joint motor 428c from linkage 422c of FIG. 4C for topology design. In response to the user selection, the linkage software application has connected design link 426a to design link 426c using a new design link 426i, and the linkage software application has further replaced joint motor 428c with pin 425c. As such, simulation 431d of linkage 422d has changed slightly from simulation 431c of linkage 422c.

Figure 4E:
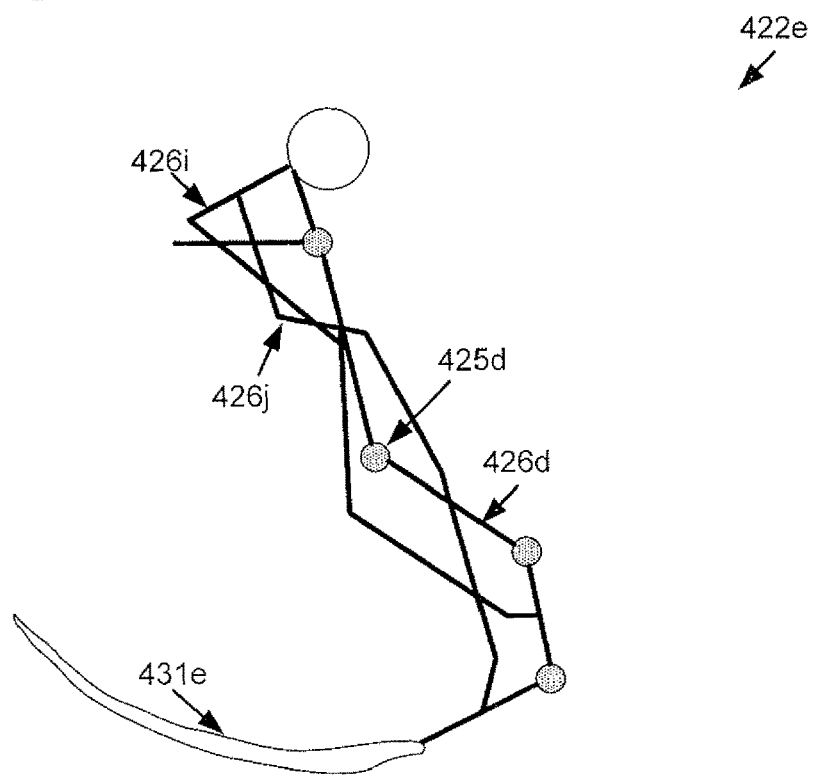
FIG. 4E presents an example of a fourth topology design step for designing a linkage-based character, according to one implementation of the present disclosure.

FIG. 4E presents an example of a fourth topology design step for designing a linkage-based character, according to one implementation of the present disclosure. As illustrated in FIG. 4E, the user has selected design link 426d, design link 426i, and joint motor 428d from linkage 422d of FIG. 4D for topology design. In response to the user selection, the linkage software application has connected design link 426d to design link 426i using a new design link 426j, and the linkage software application has further replaced joint motor 428d with pin 425d. As such, simulation 431e of linkage 422e has changed slightly from simulation 431d of linkage 422d.

Figure 4F:
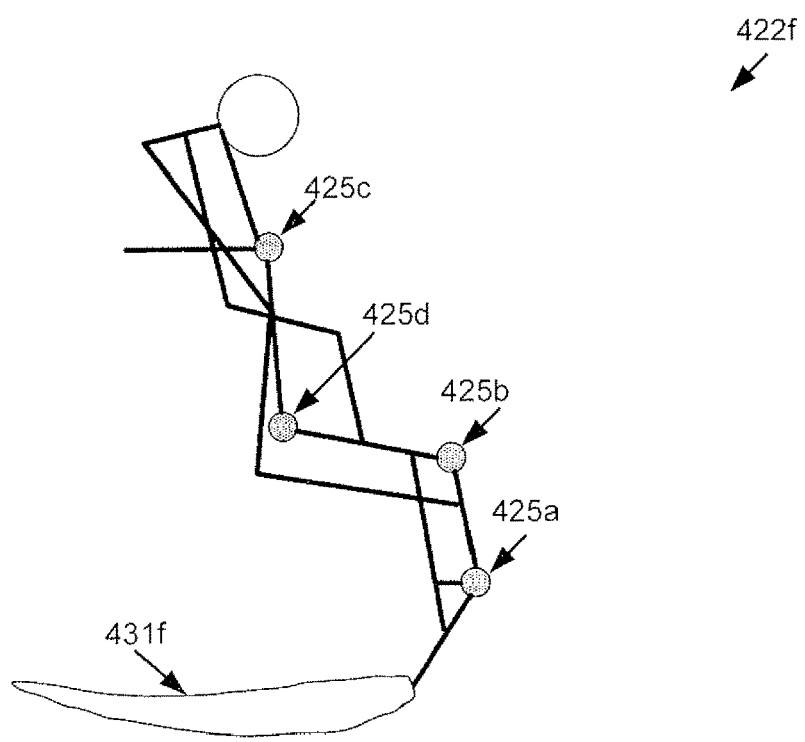
FIG. 4F presents an example of global optimization used for designing a linkage-based character, according to one implementation of the present disclosure.

FIG. 4F presents an example of global optimization used for designing a linkage-based character, according to one implementation of the present disclosure. As illustrated in FIG. 4F, the linkage software application has now utilized global optimization on linkage 422e from FIG. 4E to generate linkage 422f. For example, and as discussed above, after performing topology design on a linkage so that all of the joint motors have been replaced with pins, the linkage software application may apply global optimization to the linkage, where global optimization optimizes the location coordinates of all of the pins that were added during topology design such that the motion of the linkage is similar to the input motion from the user.

For example, after all of joint motors 428 have been replaced with each of pins 425a-d for linkage 422e from FIG. 4E, the linkage software application may utilize global optimization on linkage 422e to generate linkage 422f. As illustrated in FIG. 4F, the location coordinates for each of pins 425a-d added during the topology design have been optimized such that simulation 431f of linkage 422f is similar to simulation 431a of linkage 422a from FIG. 4A. As discussed above with regard to FIG. 4A, the user may have input simulation 431a as the motion the user wants the final linkage to make.

Figure 4G:
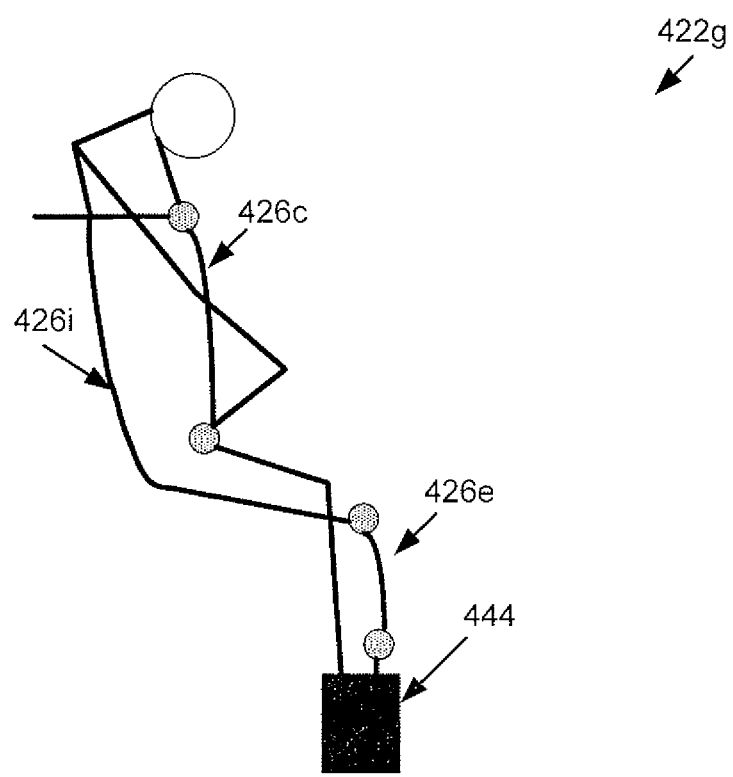
FIG. 4G presents an example of linkage shaping used for designing a linkage-based character, according to one implementation of the present disclosure.

FIG. 4G presents an example of linkage shaping used for designing a linkage-based character, according to one implementation of the present disclosure. As illustrated in FIG. 4G, the linkage software application has now utilized linkage shaping on linkage 422f from FIG. 4F to generate linkage 422g. For example, and as discussed above, after performing global optimization on a linkage so that the motion of the linkage is similar to the input motion from the user, the linkage software application may apply linkage shaping to the linkage, where linkage shaping is used to stylize the linkage by prescribing curved shapes for selected links from the user.

For example, after performing global optimization on linkage 422f from FIG. 4F, the linkage software application may have utilized linkage shaping on linkage 422f to generate linkage 422g. In such an example, the user may have selected design link 426c, design link 426e, and design link 426i from linkage 422f for linkage shaping. In response to the user selection, the linkage software application utilizes linkage shaping to curve each of design link 426c, design link 426e, and design link 426i. Furthermore, the linkage software application may have utilized linkage shaping to further add component 444 to linkage 442g. For example, and as discussed above where the user is designing a linkage-based leg of a pig as linkage 442g, component 444 may correspond to the foot of the linkage-based leg of the pig.

Figure 5:
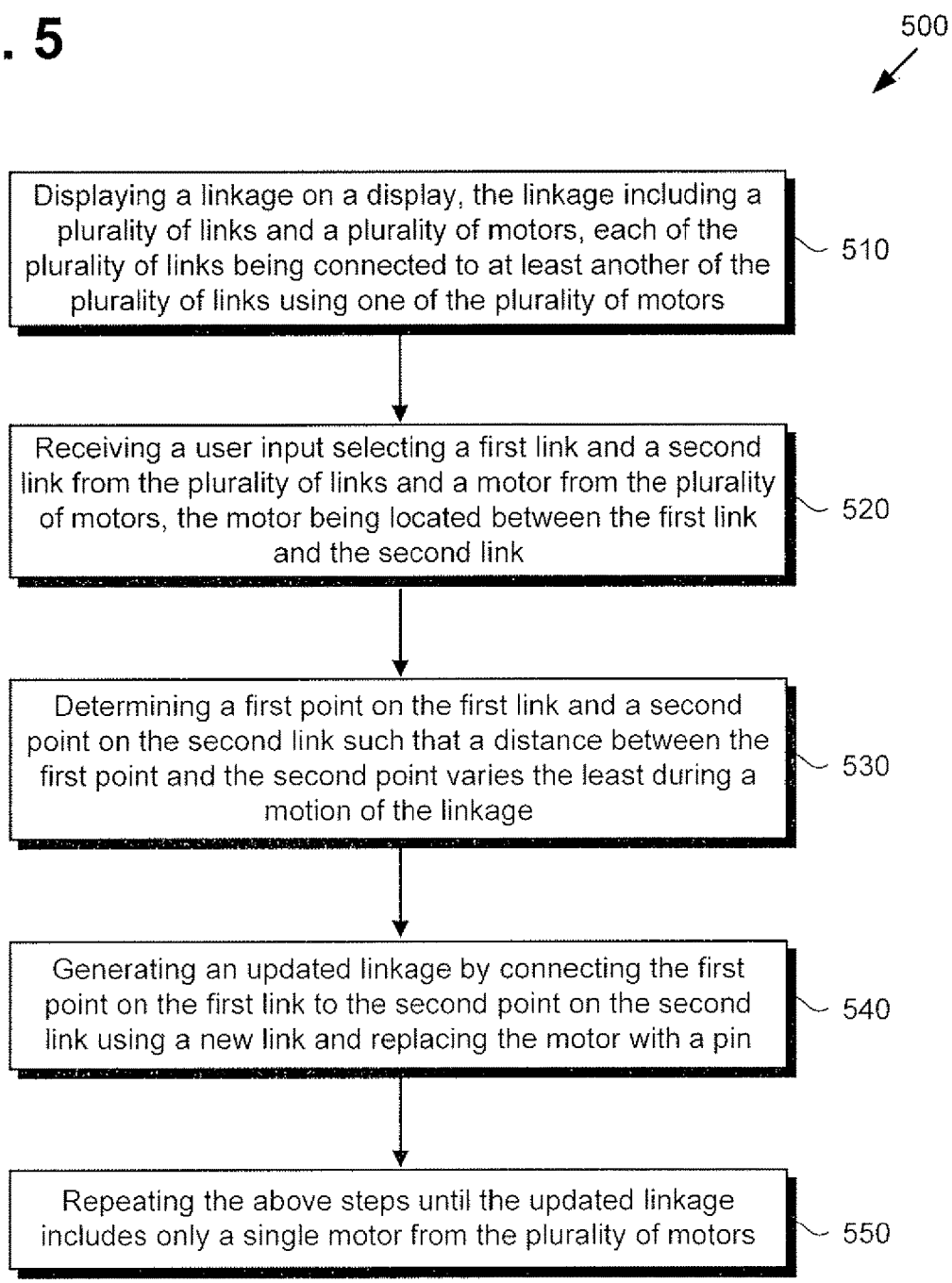
FIG. 5 shows a flowchart illustrating a method for the computational design of linkage-based characters, according to one implementation of the present disclosure.

FIG. 5 shows a flowchart illustrating a method for the computational design of linkage-based characters, according to one implementation of the present disclosure. The approach and technique indicated by flowchart 500 are sufficient to describe at least one implementation of the present disclosure, however, other implementations of the disclosure may utilize approaches and techniques different from those shown in flowchart 500. Furthermore, while flowchart 500 is described with respect to FIG. 1, the disclosed inventive concepts are not intended to be limited by specific features shown and described with respect to FIG. 1. Furthermore, with respect to the method illustrated in FIG. 5, it is noted that certain details and features have been left out of flowchart 500 in order not to obscure the discussion of inventive features in the present application.

Referring now to flowchart 500, flowchart 500 includes displaying a linkage on a display, the linkage including a plurality of links and a plurality of motors, each of the plurality of links being connected to at least another of the plurality of links using one of the plurality of motors (510). For example, processor 111 of user device 110 may execute linkage software application 120 to display linkage 122 on display 112, linkage 122 including design links 126 and motors 124, each of design links 126 being connected to another of design links 126 using one of joint motors 128 from motors 124.

Flowchart 500 also includes receiving a user input selecting a first link and a second link from the plurality of links and a motor from the plurality of motors, the motor being located between the first link and the second link (520). For example, processor 111 of user device 110 may execute linkage software application 120 to receive user input 151 selecting a first link and a second link from design links 126 and a motor from joint motors 128, the motor being located between the first link and the second link. For example, and as illustrated in FIG. 2A, the user may select design link 226d, design link 226f, and joint motor 228a from linkage 222a, where joint motor 228a is located between design link 226d and design link 226f.

Flowchart 500 also includes determining a first point on the first link and a second point on the second link such that a distance between the first point and the second point changes the least during a motion of the linkage (530). For example, processor 111 of user device 110 may execute linkage software application 120 to utilize algorithm 136 to determine a first point on the first link selected from design links 126 and a second point on the second link selected from design links 126 such that a distance between the first point and the second point changes the least during simulation 131, where simulation 131 includes a motion of linkage 122. For example, and as illustrated in FIG. 2A, distance 241 between point 240a on design link 226d and point 240b on design link 226f varies the least during simulation 231 compared to two other points on design link 226d and design link 226f.

Flowchart 500 also includes generating an updated linkage by connecting the first point on the first link to the second point on the second link using a new link and replacing the motor with a pin (540). For example, processor 111 of user device 110 may execute linkage software application 120 to update linkage 122 by utilizing link insertion 137 to connect the first point on the first link selected from design links 126 to the second point from the second link selected from design links 126 using a new link added to design links 126, and by utilizing motor replacement 138 to replace the selected motor from joint motors 128 with one of pins 125.

For example, and as illustrated in FIG. 2B, design link 226d is connected to design link 226f using a new design link 226g, where the new design link 226g connects point 240a from design link 226d to point 240b from design link 226, which were illustrated in FIG. 2A. Furthermore, joint motor 228a from FIG. 2A is replaced by pin 225 in FIG. 2B.

Optionally, flowchart 500 also includes repeating the above steps until the updated linkage includes only a single motor from the plurality of motors (550). For example, processor 111 of user device 110 may execute linkage software application 120 to keep receiving user input 151 selecting a first link and a second link from design links 126 and a motor from joint motors 128, and then keep updating linkage 122 by connecting the first link to the second link using a new link and replacing the motor with a pin. Linkage software application 120 will stop receiving user input 151 when linkage 122 only includes drive motor 129 from motors 124.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

What is claimed is:

1. A system comprising:
a display;
a memory storing a software application; and
a processor configured to execute the software application to:
  receive a first motion from a user for designing a linkage-based character;
  in response to receiving the first motion from the user, create a linkage for the linkage-based character that is displayed on the display, the linkage including a plurality of links and a plurality of motors, each of the plurality of links being connected to at least another of the plurality of links using one of the plurality of motors, wherein the plurality of motors are created to reproduce joint trajectories according to the first motion received from the user;
  simulate the linkage to show the first motion on the display to a user;
  receive a first user input selecting a first link and a second link from the plurality of links and a first motor from the plurality of motors, the first motor being connected to the first link and the first motor being further connected to a third link that is connected to the second link using a second motor of the plurality of motors;
  in response to receiving the first user input selecting the first link, the second link and the first motor, update the linkage by adding a new link to connect the first link to the second link while the first link and the second link remain connected using the third link and the second motor, and by replacing the first motor with a pin enabling the updated linkage to perform a second motion similar to the first motion, wherein the updating uses the new link to connect the first link to the second link at points that optimize the updated linkage to perform the second motion similar to the first motion; and simulate the updated linkage, including the first link and the second link connected directly using the new link and connected indirectly using the pin, the third link and the second motor, to show the second motion on the display enabling the user to compare the similarity between the first motion and the second motion.

2. The system of claim 1, wherein before generating the updated linkage, the processor is further configured to execute the software application to:

determine a plurality of updated linkages including the updated linkage, each of the plurality of updated linkages including the new link connecting the first link to the second link and replacing the first motor with the pin;

display the plurality of updated linkages including the updated linkage on the display; and receive a user selection for the updated linkage from the plurality of linkages.

3. The system of claim 2, wherein the processor is further configured to execute the software application to simulate each of the plurality of updated linkages being displayed on the display.

4. The system of claim 1, wherein the points are a first point on the first link and a second point on the second link and selected such that a distance between the first point and the second point changes the least compared to any other two points on the first link and the second link while the updated linkage performs the second motion.

5. The system of claim 1, wherein the linkage is displayed on the display using a user interface for a user to select the first link, the second link, and the motor using the user interface.

6. The system of claim 1, wherein the processor is further configured to execute the software application to:

receive a plurality of user inputs, each of the plurality of user inputs selecting another first link and another second link from the plurality of links and another motor from the plurality of motors, the another motor being located between the another first link and the another second link; and for each of the plurality of user inputs, generate an another updated linkage by connecting the another first link to the another second link using another new link and replacing the another motor with another pin.

7. The system of claim 6, wherein the processor is further configured to execute the software application to receive the plurality of user inputs until the another updated linkage includes only a single motor from the plurality of motors.

8. The system of claim 1, wherein the processor is further configured to execute the software application to receive a second user input for adding an auxiliary link to the updated linkage, wherein the auxiliary link does not affect the function of the updated linkage, and wherein the auxiliary link connects a user selected first link to a user selected second link from the plurality of links.

9. A method for optimizing a linkage, the method comprising:

receiving a first motion from a user for designing a linkage-based character;

in response to receiving the first motion from the user, creating the linkage for the linkage-based character that is displayed on a display, the linkage including a plurality of links and a plurality of motors, each of the plurality of links being connected to at least another of the plurality of links using one of the plurality of motors, wherein the plurality of motors are created to reproduce joint trajectories according to the first motion received from the user;

simulating the linkage to show the first motion on the display to a user;

receiving a first user input selecting a first link and a second link from the plurality of links and a first motor from the plurality of motors, the first motor being connected to the first link and the first motor being further connected to a third link that is connected to the second link using a second motor of the plurality of motors;

in response to receiving the first user input selecting the first link, the second link and the motor, updating the linkage by adding a new link to connect the first link to the second link while the first link and the second link remain connected using the third link and the second motor, and by replacing the first motor with a pin enabling the updated linkage to perform a second motion similar to the first motion, wherein the updating uses the new link to connect the first link to the second link at points that optimize the updated linkage to perform the second motion similar to the first motion; and simulating the updated linkage, including the first link and the second link connected directly using the new link and connected indirectly using the pin, the third link and the second motor, to show the second motion on the display enabling the user to compare the similarity between the first motion and the second motion.

10. The method of claim 9, wherein before generating the updated linkage, the method further comprises:

determining a plurality of updated linkages including the updated linkage, each of the plurality of updated linkages including the new link connecting the first link to the second link and replacing the motor with the pin;

displaying the plurality of updated linkages including the updated linkage on the display; and receiving a user selection for the updated linkage from the plurality of linkages.

11. The method of claim 10, wherein the method further comprises simulating each of the plurality of updated linkages being displayed on the display.

12. The method of claim 9, wherein the points are a first point on the first link and a second point on the second link and selected such that a distance between the first point and the second point changes the least compared to any other two points on the first link and the second link while the updated linkage performs the second motion.

13. The method of claim 9, wherein the linkage is displayed on the display using a user interface for a user to select the first link, the second link, and the motor using the user interface.

14. The method of claim 9, wherein the method further comprises:

receiving a plurality of user inputs, each of the plurality of user inputs selecting another first link and another second link from the plurality of links and another motor from the plurality of motors, the another motor being located between the another first link and the another second link; and for each of the plurality of user inputs, generating an another updated linkage by connecting the another first link to the another second link using another new link and replacing the another motor with another pin.

15. The method of claim 14, wherein the method further comprises receiving the plurality of user inputs until the another updated linkage includes only a single motor from the plurality of motors.

16. The method of claim 9 further comprising receiving a second user input for adding an auxiliary link to the updated linkage, wherein the auxiliary link connects a user selected first link to a user selected second link from the plurality of links.

17. A method for optimizing a linkage, the method comprising:

receiving a first motion from a user for designing a linkage-based character;

in response to receiving the first motion from the user, creating the linkage for the linkage-based character that is displayed on a display, the linkage including a plurality of links and a plurality of motors, each of the plurality of links being connected to at least another of the plurality of links using one of the plurality of motors, wherein the plurality of motors are created to reproduce joint trajectories according to the first motion received from the user;

simulating the linkage to show the first motion on the display to a user;

receiving a first user input selecting a first link and a second link from the plurality of links and a motor from the plurality of motors, the motor being located between the first link and the second link;

in response to receiving the first user input selecting the first link, the second link and the motor, updating the linkage by connecting the first link to the second link using a new link, and replacing the motor with a pin enabling the updated linkage to perform a second motion similar to the first motion, wherein the updating uses the new link to connect the first link to the second link at points that optimize the updated linkage to perform the second motion similar to the first motion; and simulating the updated linkage to show the second motion on the display enabling the user to compare the similarity between the first motion and the second motion.

18. The method of claim 17, wherein the method further comprises:

receiving a plurality of user inputs, each of the plurality of user inputs selecting another first link and another second link from the plurality of links and another motor from the plurality of motors, the another motor being located between the another first link and the another second link; and for each of the plurality of user inputs, generating an another updated linkage by connecting the another first link to the another second link using another new link and replacing the another motor with another pin.

19. The method of claim 18, wherein the method further comprises receiving the plurality of user inputs until the another updated linkage includes only a single motor from the plurality of motors.

\* \* \* \* \*